Figure 1:
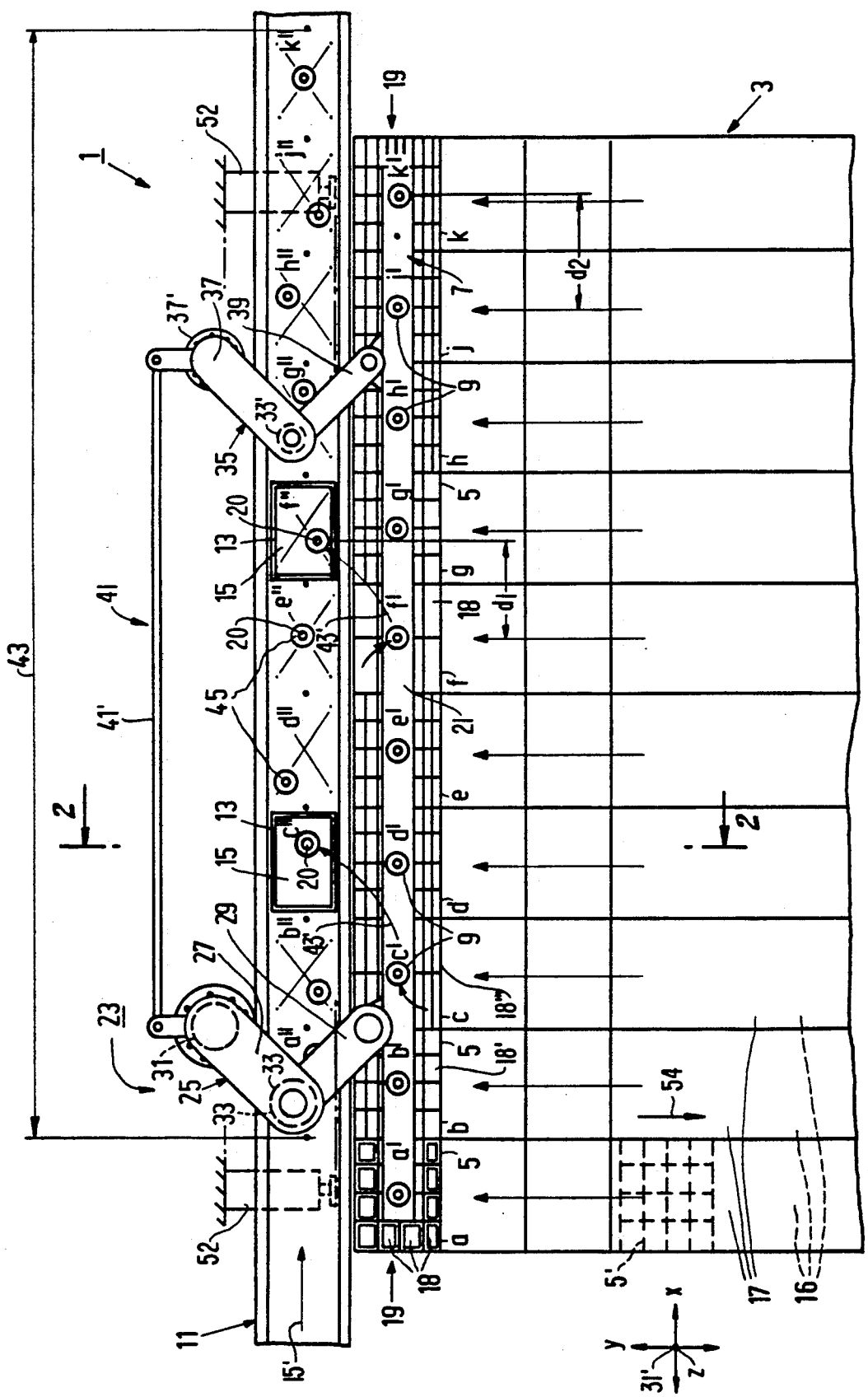

United States Patent [19]

Weeber

[11] Patent Number: 5,007,162

[45] Date of Patent: Apr. 16, 1991

[54] METHOD AND DEVICE FOR PLACING COMPONENTS ON A SUPPORT

[75] Inventor: Adrianus A. R. Weeber, Alkmaar, Netherlands

[73] Assignee: U.S. Philips Corporation, New York, N.Y.

[21] Appl. No.: 460,460

[22] Filed: Jan. 3, 1990

[30] Foreign Application Priority Data

Jan. 6, 1989 [NL] Netherlands ............... 8900027

[51] Int. Cl.⁵ .................. H05K 3/30; B23P 19/00
[52] U.S. Cl. ...................... 29/839; 29/740; 29/840; 228/6.2
[58] Field of Search ........... 29/740, 741, 830, 833, 29/834, 840, 832; 228/6.2

[56] References Cited

U.S. PATENT DOCUMENTS

| | | |
|---|---|---|
| 4,151,945 | 5/1979 | Ragard et al. |
| 4,231,153 | 11/1980 | Browne |
| 4,480,780 | 11/1984 | Claeskens et al. ........... 29/834 X |
| 4,631,816 | 12/1986 | Fujita et al. ........... 29/840 X |
| 4,644,642 | 2/1987 | Wardenaar et al. |
| 4,810,018 | 3/1989 | van de Ven |
| 4,819,699 | 4/1989 | Brown et al. ........... 29/741 X |
| 4,881,319 | 11/1989 | Yagi et al. ........... 29/740 X |

FOREIGN PATENT DOCUMENTS

| | | | |
|---|---|---|---|
| 56-153742 | 11/1981 | Japan | 228/6.2 |
| 57-63835 | 4/1982 | Japan | 228/6.2 |
| 57-63836 | 4/1982 | Japan | 228/6.2 |
| 63-95631 | 4/1988 | Japan | 228/6.2 |

OTHER PUBLICATIONS

Self-Organizing Feature Maps and the Travelling Salesman Problem, "Neural Networks", vol. 1, pp. 289-293, 1988 by Bernard Angeniol, Gael de la Croix Vaubois and Jean-Yves le Texier.

*Primary Examiner*—Carl E. Hall
*Assistant Examiner*—Carl J. Arbes
*Attorney, Agent, or Firm*—William Squire

[57] ABSTRACT

By a pick-up device having pick-up elements, components are picked up one by one from differently spaced positions in tray packings, are moved together above component receiving supports and are then placed one by one on different ones of the supports. The supports are transported along a supply and discharge track. The tray packings are displaced through a supply and discharge mechanism to a presentation position and remain fixed in the presentation position during removal of the components. The components have varying shapes and are of comparatively large dimensions.

14 Claims, 2 Drawing Sheets

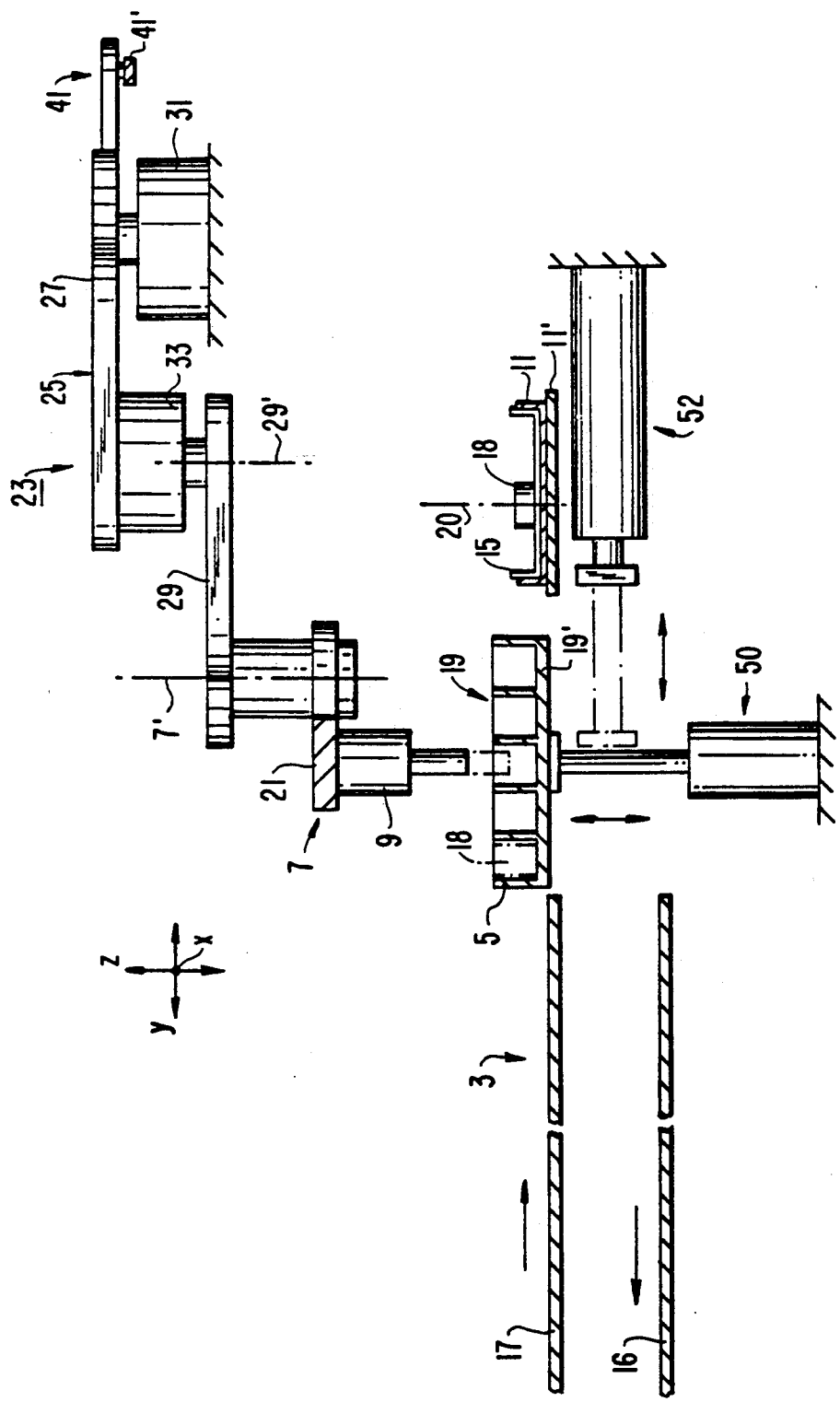

METHOD AND DEVICE FOR PLACING COMPONENTS ON A SUPPORT

The invention relates to a method of placing components on a support, in which within a placement cycle a number of components are picked up from a presentation position by means of a pick-up device comprising a number of pick-up elements, after which the pick-up device is moved above the support and all the pick-up elements are positioned one by one above the desired position on the support by the support and the relevant component is placed in this position. The invention also relates to a device for placing components on a support.

The invention more particularly relates to placing electric, electronic and/or mechanical components on a printed circuit board.

Of interest is commonly owed copending application Ser. No. 576,321, entitled "Device Comprising At Least Two Manipulators, Positioning Device Suitable For Placing Electrical Components On A Support And Pick-Up Device Suitable For Use In Such A Position Device" filed Aug. 29, 1990 in the name of P. Corbey.

A method of the kind to which the present invention relates is described in EP No. 0,092,292,B1 corresponding to U.S. Pat. No. 4,644,642. In this known method, all components are supplied in tape packing and a series of components are picked up simultaneously from a fixed presentation position. By means of this known device, components supplied in tray packings, in which the number of components present per tray packings can vary widely, cannot be processed because the positions in which components must be picked up are not constant.

The invention has for its object to provide a method of the kind mentioned hereinbefore, by which a number of components can be picked up from tray packings and can be placed on a support. According to the invention, this object is mainly achieved in that the components are supplied in positioned tray packings and such a movement is performed by the pick-up device that by means of the pick-up elements components are picked up one by one from different tray packings.

Components which are packed not in tape, but in tray packings because of their exotic form and their size can be placed rapidly and efficiently on supports by means of the method according to the invention. These components often have different dimensions and varying shapes and the number of components per tray packing and the distribution of these components over a tray packing can vary widely. The number of pick-up elements is preferably equal to the number of tray packings. The pick-up elements are preferably arranged in a line at a regular pitch distance. The maximum number of components to be picked up is equal to the number of pick-up elements of the pick-up device. Although it is known from U.S. Pat. No. 4,151,945 to pick up components from tray packings, in this known method the number of pick-up elements is limited to two. Thus, each pick-up element must be able to reach at least half the number of tray packings. As a result, this method is considerably slower than the method according to the invention.

In a preferred embodiment of the method according to the invention, both during the step of picking up and during the step of placing components a joint movement is performed by the pick-up elements in the x, y plane and separate movements are performed in the z direction defined at right angles to the support. Due to this joint movement in the x, y plane, an efficient method of picking up the components one by one and then placing the components one by one is obtained.

In another preferred embodiment of the method according to the invention, the sequence in which the pick-up elements are moved above the presentation position and the sequence in which the components are picked up and placed are chosen so that, taking into account the logistic sequence, the required displacement time is shortest. Thus, components can be picked up and placed at a very high speed. This guarantees a comparatively short placement cycle.

In a further preferred embodiment of the method according to the invention, the components are placed by the pick-up device in the same placement cycle on different supports. In a still further preferred embodiment of the method according to the invention, the supports are displaced after a placement cycle within a placement trajectory linear distance in the x direction over a distance which is equal to or is a multiple of the distance between two adjacent pick-up elements. These measures increase the degree of occupation of the machine.

The invention further relates to a device. The device mainly comprising a supply and discharge mechanism for tray packings, a displaceable pick-up device comprising a number of pick-up elements and a supply and discharge mechanism for supports and is characterized according to the invention by a two-armed robot, whose first and second arms can be moved separately by motors, a two-armed auxiliary mechanism whose first and second arms have the same length as the first and second arms of the robot, a coupling mechanism between the first arm of the auxiliary mechanism and the first arm of the robot and in which the pick-up device comprising pick-up elements is secured to the second arm of the robot and to the second arm of the auxiliary mechanism. The coupling mechanism ensures that the first arm of the auxiliary mechanism performs a movement identical to that of the first arm of the robot. The pick-up device with pick-up elements is secured to the free end of the second arm of the robot and to the free end of the second arm of the auxiliary mechanism. The pick-up device thus remains in parallel positions during the placement motions. The robot may have a standard construction, which is commercially available. The advantage of the two rotating movements to realize the movement in the x, y plane is that this movement can be performed with greater accuracy and simplicity and hence at lower cost than by means of two linear orthogonal displacement mechanisms (displacements in separate, discrete x-y directions).

A preferred embodiment of the device according to the invention is characterized by a number of supply and discharge tracks arranged in a row for the transport of tray packings. As a result, a continuous supply of components is guaranteed.

A preferred embodiment of the device according to the invention is characterized by an elongate supply and discharge track for conveying component supports. Thus, an uninterrupted supply of supports can be realized. Due to the measures according to the invention, a device is obtained, in which a great variety of different components can be rapidly placed on supports.

IN THE DRAWING

The invention will be described more fully with reference to the drawing.

FIG. 1 is a diagrammatic plan view of an apparatus according to one embodiment of the present invention; and FIG. 2 is a sectional side elevation view of the apparatus of FIG. 1 taken along lines 2—2.

The drawing shows diagrammatically an embodiment of a device for placing components on a support according to the invention. The components consist, for example, of electrical and/or electronic components and are placed on a printed circuit board. Mechanical components, such as cooling plates, may also be placed on the printed circuit board.

The device 1 mainly comprises a supply and discharge mechanism 3 for tray packings 5, a displaceable pick-up device 7 comprising a number of pick-up elements 9 and a supply and discharge track 11 for supports 15, along which the supports 15 can be transported in direction 15' via an endless belt or the like. The supply and discharge mechanism 3 is composed of a row of parallel supply tracks 17 and a row of parallel discharge tracks 16 located below the supply tracks 17. Tracks 16 and 17, may for example, comprise endless belts. Along the supply tracks 17, each of the full tray packings 5 with the components 18 to be placed are passed to a presentation position 19 on corresponding presentation supports 19' and are positioned in a row beside each other in direction 15'. The tray packings 5 comprise a plurality of open compartments in an ordered pattern (e.g. grid or lattice pattern), each of which compartments is suited to store one of the components 18. The packings 5 may have different size compartments as shown by the different size boxes in the different packings 5. For example, compartment 18' is larger than compartment 18". Compartment 18''' is longer in direction 15' than compartments 18' and 18". The pick-up device 7 consists of a linear beam 21, to which the pick-up elements 9 are secured, and is moved by a mechanism 23. Element 9 can be as described in U.S. Pat. No. 4,810,018 incorporated by reference herein. Mechanism 23 comprises a two-armed robot 25, whose first and second arms 27, 29 are separately moved by motors 31 and 33, respectively, a second two-armed auxiliary mechanism 35, whose first and second arms 37, 39, respectively, have the same length as the respective first and second arms 27, 29 of the robot 25, and a coupling mechanism 41 connecting the first arm 37 of the auxiliary mechanism 35 to the first arm 27 of the robot 25. Arm 37 is rotatably secured to bearing support 37'. The pick-up device 7 is secured to the second arm 29 of the robot 25 and to the second arm 39 of the auxiliary mechanism 35. By means of the coupling mechanism 41, the first arm 37 of the auxiliary mechanism 35 performs the same movement as the first arm 27 of the robot 25. A motor 33' moves arm 39 relative to arm 37 in synchronism with arm 29 motions. In this embodiment, the coupling mechanism 41 includes a coupling rod 41'. Due to the fact that the first and second arms 37, 39 of the auxiliary mechanism 35 have the same length as the respective first and second arms 27, 29 of the robot 25, the pick-up device 7 with pick-up elements 9 can be moved in translation in parallel to track 11 and normal to tracks 16 and 17.

The operation of the device 1 shown will now be explained briefly. The compartments 18', 18" and 18''' are situated in direction 15 at different pitches due to their different sizes. The difference in compartment dimensions is to accommodate different dimensioned components. As a result, these components are at different pitches in direction 15'. The mechanism 23 causes a selected element 9 to assume a position of these different pitches in order to pick up a corresponding component 18. Therefore, the mechanism 23 is programmed accordingly. The motors 31, 33 and 33' and mechanism 41 move the device 7 in directions parallel to direction 15' in order to appropriately place a pick-up element 9 over a corresponding component in a compartment 18', 18" or 18'''. The supports 15 to be provided with components 18 are displaced along the supply and discharge track 11 over a distance equal to or a multiple of the distance $d_1$ between two adjacent pick-up elements 9 within a placement trajectory distance 43. Distance 43 is the distance between end elements 9 when over track 11. The device 7 follows trajectory 43' over linear distance $d_1$ in this example. In tray packings 5, the components 18 to be placed are passed along the supply tracks 17 to the presentation position 19. A stock of a few tray packings 5 is present on each of the supply tracks 17. In the presentation position 19, the tray packings 5 are positioned and the components 18 are taken in an arbitrary sequence one by one from the tray packings 5 regardless the different pitch of the component in packings 5. During emptying of the tray packings 5, the latter remain stationary in the presentation position 19. When a tray packing 5 is empty, it is discharged along a discharge track 16. This is done by first displacing the packing 5 vertically down to lower discharge track 16 via an elevator mechanism 50. Packing 5 is then pushed in horizontal direction 54 by mechanism 52. Mechanisms 50 and 52, by way of example, may be hydraulically operated devices having piston operated push rods. A full tray packing 5 is then passed by the supply and discharge mechanism 3 track 17 to the presentation position 19. After the pick-up elements 9 a' to k' have picked up the components 18 one by one from the tray packings 5 a to k, the pick-up device 7 filled with the pick-up elements 9 and attached components 18 is moved over the placement trajectory 43' at a position over the supports 15. The components 18 are then placed one by one in the desired positions 20 on the supports 15 a" to k" by displacement of elements 9 as described in U.S. Pat. No. 4,644,642. This is the end of a placement cycle; the cycle can start again: displacing the supports 15, picking-up components 18 one by one and placing the components 18 one by one on the supports 15, etc. As shown in the drawing, the relative spacing of elements 9, packings 5 and supports 15 are different in each corresponding array in direction 15'.

By the pick-up elements 9, a joint movement in the x, y direction is performed in the x, y (horizontal) plane both during the step of picking-up and during the step of placing components 18 and separate movements are performed in the z direction defined at right angles to the support 15. The sequence in which the components 18 are picked up and the sequence in which the components 18 are placed is chosen so that, taking into account the logistic order, the displacement time required is shortest. This can be realized according to the manner as described in U.S. Pat. No. 4,684,642, incorporated by reference herein. The entire mechanism 23 may be displaced in direction 31' vertically (z direction) by a mechanism (not shown) secured to motor 31 and bearing support 37' for arm 35.

In order to determine the order of succession in which the components are picked up and placed, use may be made of known methods, which are developed to solve the so-called "travelling salesman problem" (TSP). The TSP is the problem to determine a shortest possible route along a number of towns.

This is a problem similar to that of determining the order of succession in which components are placed in given positions, in which case the pick-up device must cover a shortest possible route so that the displacement time is as short as possible. A method of solving the TSP is described in the magazine "Neural Networks, Vol. 1 pp. 289-293, 1988".

For supplying the tray packings 5, a number of alternatives are possible. The tray packings 5 may be supplied and discharged, for example, along ramps, vibratory troughs, transport tracks, roller tracks or stackwise. Auxiliary tools 45, such as wire-reversing tools, may be arranged in the track 11 for supplying supports. The pick-up elements may be provided with toothed wheels and may be coupled by means of a rack so that the pick-up elements can perform an identical rotation about their longitudinal axis.

What is claimed is:

1. A method of placing components on a support, in which within a placement cycle a number of components are picked up from a presentation position in which the components are in a first array of a given spacing in a given direction by means of a pick-up device comprising a number of pick-up elements in a second array in a second spacing in the given direction, after which the pick-up device is moved above the support and all the pick-up elements are positioned one by one above the desired position on the support by the relative movement of the pick-up device with respect to the support and the relevant component is placed in this position in a third spacing of a third array, characterized in supplying the components positioned in said first array in tray packings, picking up the components one by one from the different tray packings to place them in the second array and then placing the components one by one on the support in said third array wherein the spacings of the first, second and third arrays differ.

2. A method as claimed in claim 1 during the step of picking up and during the step of placing components including the step of moving the pick-up elements in an x, y plane in one common path and moving the elements in a z direction defined at right angles to the support and to said x, y plane.

3. A method as claimed in claim 2 including the step of selecting the shortest required displacement time in the sequence of picking up and placing the components.

4. A method as claimed in claim 1, wherein a placement cycle includes picking up a component and placing it on a support, said method including placing a different component on a different support and placing a plurality of the components in a placement cycle on different supports.

5. A method as claimed in claim 2, characterized in displacing the supports after a placement cycle within a placement trajectory distance in the x direction over a distance which is equal to or is a multiple of the distance between two adjacent pick-up elements.

6. A device for placing components on a support comprising a supply and discharge mechanism for tray packings, a displaceable pick-up device comprising a plurality of pick-up elements and a supply and discharge track for supports, characterized by
   a two-armed robot having first and second arms each of a given length;
   a two-armed auxiliary mechanism having third and fourth arms each of the same respective length as the first and second arms;
   a coupling mechanism for coupling the third arm of the auxiliary mechanism to the first arm of the robot so they move in unison, and
   a plurality of pick-up elements secured to the second arm of the robot and the fourth arm of the auxiliary mechanism.

7. A device as claimed in claim 6 further including a plurality of supply and discharge tracks arranged in a row for receiving and transporting said tray packings.

8. A device as claimed in claim 7 further including an elongate supply and discharge track for receiving and passing component receiving supports.

9. A method of claim 2 wherein said step of moving the pick-up elements in the x, y plane is non-linear.

10. The method of claim 1 wherein said picking up the components step includes picking components in said second array in which the components are in different component-to-component spacings in said second array.

11. An apparatus for placing components on a support comprising:
    means for supplying a first array of components, said array being such that the components have different spacings relative to one another in the array;
    component pick-up means including a plurality of pick-up elements having a fixed relative spacing different than the first array spacings;
    support means for receiving the components in a second array of a given relative spacing; and
    robot means for picking up said components in said first array with said pick-up means so as to place the components in said fixed spacing on said pick-up means and for then discharging the components onto said support means in said second array.

12. The apparatus of claim 11 wherein said second array has a spacing which is an integral multiple of said fixed spacing.

13. The apparatus of claim 11 wherein said fixed spacing is linear, said means for supplying includes receptacle means for positioning the components in different x and y spacings in a plane parallel to said fixed spacing.

14. The apparatus of claim 13 wherein said fixed spacing is uniform between adjacent elements.

* * * * *